US006870195B2

(12) United States Patent
Lemoff et al.

(10) Patent No.: US 6,870,195 B2
(45) Date of Patent: Mar. 22, 2005

(54) ARRAY OF DISCRETELY FORMED OPTICAL SIGNAL EMITTERS FOR MULTI-CHANNEL COMMUNICATION

(75) Inventors: Brian E. Lemoff, Union City, CA (US); Lisa A. Windover, SanFrancisco, CA (US); Scott A. Corzine, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 2 days.

(21) Appl. No.: 10/370,853

(22) Filed: Feb. 21, 2003

(65) Prior Publication Data

US 2004/0165845 A1 Aug. 26, 2004

(51) Int. Cl.[7] ............................................. H01L 33/00
(52) U.S. Cl. .............................. 257/79; 257/79; 257/80
(58) Field of Search ............................ 257/79, 80, 81, 257/88, 72, 13, 94, 95; 385/49

(56) References Cited

U.S. PATENT DOCUMENTS

| | | |
|---|---|---|
| 5,073,041 A | 12/1991 | Rastani |
| 5,164,949 A | 11/1992 | Ackley et al. |
| 5,216,263 A * | 6/1993 | Paoli ........................... 257/88 |
| 5,493,577 A | 2/1996 | Choquette et al. |
| 5,758,951 A | 6/1998 | Haitz |
| 5,978,408 A | 11/1999 | Thornton |
| 6,004,042 A | 12/1999 | Million et al. |
| 6,051,848 A | 4/2000 | Webb |
| 6,117,699 A | 9/2000 | Lemoff et al. |
| 6,195,485 B1 | 2/2001 | Coldren et al. |
| 6,208,681 B1 | 3/2001 | Thornton |
| 6,234,687 B1 | 5/2001 | Hall et al. |
| 6,259,715 B1 | 7/2001 | Nakayama |
| 6,263,002 B1 | 7/2001 | Hsu et al. |
| 6,297,068 B1 | 10/2001 | Thornton |
| 6,328,482 B1 | 12/2001 | Jian |
| 6,419,404 B1 | 7/2002 | Deri et al. |

* cited by examiner

*Primary Examiner*—David Nelms
*Assistant Examiner*—Thinh T Nguyen

(57) ABSTRACT

An optical signal emitter for a multi-channel, wavelength division multiplexed (WDM) optical communication system is disclosed. This optical signal emitter does not require an optical multiplexer, or other device, to combine components of an optical signal. Semiconductor die attached to a substrate emit independent components of a multi-channel optical signal from emission apertures that are positioned offset from the center of the die toward an aperture corner of the die. This aperture corner may be shaped so that the apertures can be located closer to each other. The shaping of the die may include a photolithographic process, an etching process, a reactive ion etching process, or a combination thereof.

25 Claims, 4 Drawing Sheets

ARRAY OF DISCRETELY FORMED OPTICAL SIGNAL EMITTERS FOR MULTI-CHANNEL COMMUNICATION

BACKGROUND

In recent years, fiber optic networks that transmit optical signals have come into widespread use for telecommunications and data communications. Due to ever-increasing demand for faster data transmission rates, efforts have been directed to the development of high-capacity optical communication systems. Such systems typically use one or more optical signals to convey across an optical transport medium data, applications, content, or other information, which are collectively termed "information" herein.

One technique for increasing the capacity of an optical communications or network system is to multiplex information from a number of sources. In wavelength division multiplexing (WDM), a number of channels of information are conveyed on different, non-interfering wavelengths that are transmitted through a single optical transport medium. Suitable optical transport media include, among others: a free-space interconnect, for short distance optical communication; or a fiber optic cable.

Wavelength division multiplexing transports a multi-channel optical signal that includes a number of components, each of which carries independent information. Each optical signal component is emitted from a light source corresponding to that signal component, and is emitted at a wavelength that is unique within the multi-channel optical signal. The optical signal components do not interfere with each other because they have different wavelengths.

However, one problem with WDM is that additional complexity in the design, Fabrication, and packaging of the required devices can dramatically increase production and maintenance costs. For example, an optical wavelength multiplexer is often used to collect the optical signal components from different sources and cause these components to spatially overlap and enter into a single optical fiber. An optical multiplexer can be a costly, high precision device.

This drawback to the use of WDM is particularly problematic in applications requiring only relatively short distance links. Such applications of optical communication systems are typically more cost sensitive than other applications. If a complex optical multiplexer is required then an optical communication system may not be cost effective for such links.

SUMMARY OF THE INVENTION

The invention provides a multi-channel optical signal emitter for a wavelength division multiplexed (WDM) communication system that combines multiple signal components into a multi-channel optical signal without using an optical multiplexer or other device external to the emitter.

In accordance with the invention, a multi-channel optical signal emitter includes multiple semiconductor die. Each die is configured to emit a channel of the multi-channel optical signal from an emission aperture located offset from the center of the die toward an aperture corner of the die. The die are attached to a substrate with the emission apertures collectively defining a signal-emitting area and the aperture corners of each die pointing toward the center of the signal-emitting area.

In accordance with the invention, a multi-channel optical signal emitter is manufactured by fabricating multiple optical signals emitters, each configured to emit an optical signal from an emission aperture near an aperture corner of the optical signal emitter. Then, the optical signal emitters are positioned on the substrate with the emission apertures near each other; and are attached to the substrate.

BRIEF DESCRIPTION OF THE DRAWING

The drawing illustrates technologies related to the invention, shows example embodiments of the invention, and gives examples of using the invention. The objects, features and advantages of the invention will become more apparent from the following detailed description, when read in conjunction with the accompanying drawing, wherein.

DETAILED DESCRIPTION OF THE PREFERRED EMBODIMENTS

The descriptions and discussions herein illustrate technologies related to the invention, show examples of the invention and give examples of using the invention. Known methods, procedures, systems, circuits, or components may be described without giving details so as to avoid obscuring the principles of the invention. On the other hand, details of specific embodiments of the invention are described, even though such details may not apply to other embodiments of the invention.

Some terms used herein are not to be interpreted in their mathematical sense of being ideal, accurate and perfect, but rather as being generally descriptive in spite of potentially large approximations, variations and design tradeoffs. Such terms include, but are not limited to, circle, center, concentric, cylinder, equal, greater than, exceed, less than, angle, triangle, parallelogram and polygon. Manufacturing tolerances, manufacturing variations from specifications, product defects, changes to a device after manufacturing, design tradeoffs, design approximations, and the like are commonplace in commercial goods.

Figure 1A:
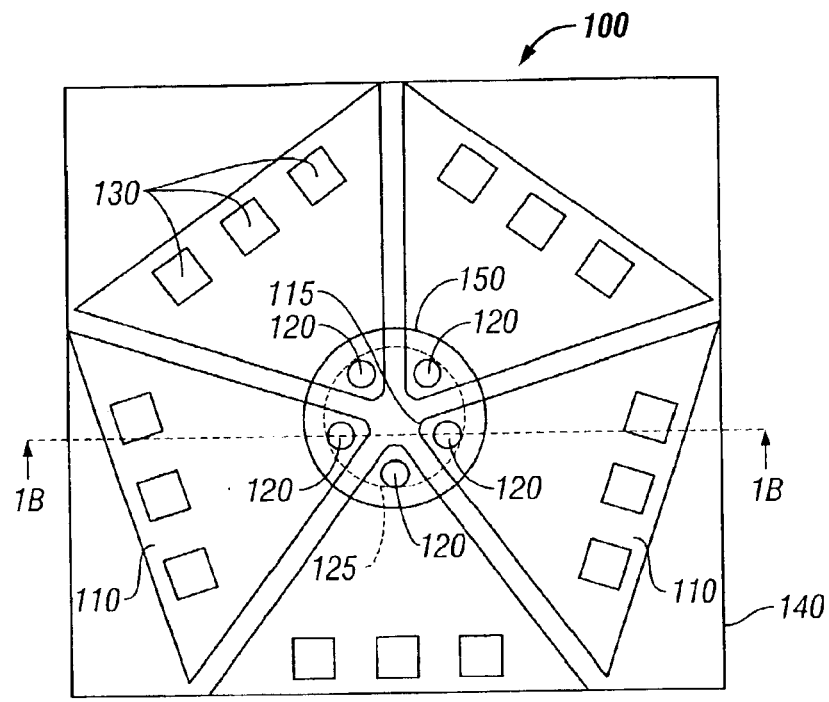
FIGS. 1A and 1B show a first example of the invention, which emits an optical signal with five independent components into an optical fiber, with FIG. 1A being a top view and FIG. 1B being a cross sectional view along section line 1B—1B.
Figure 1B:
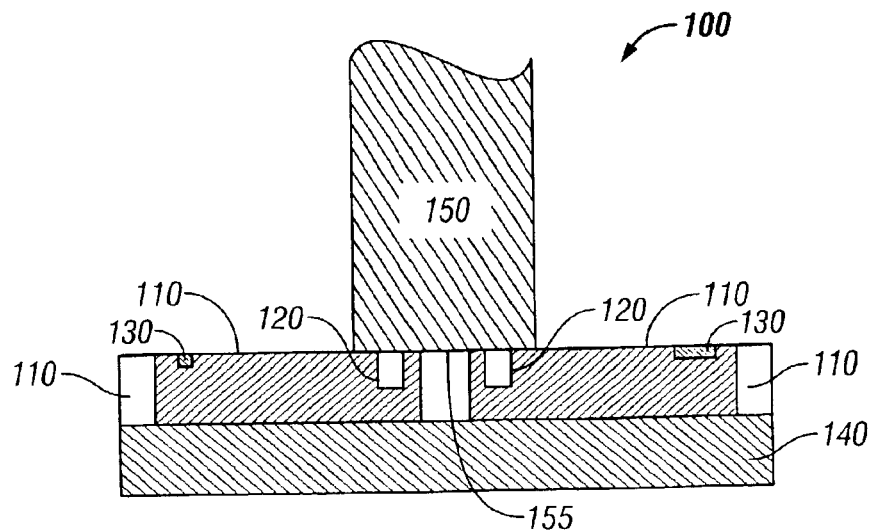

FIGS. 1A and 1B show multi-channel optical signal emitter 100 according to an embodiment of the invention. Optical signal emitter 100 emits a multi-channel optical signal with five independent components into an optical fiber. FIG. 1A is a top view of optical signal emitter 100. FIG. 1B is a cross sectional view taken along section line 1B—1B, which is shown in FIG. 1A.

In the embodiment of the invention shown in FIGS. 1A and 1B, five semiconductor die 110 are used. Each die 110 includes an emission aperture 120 that emits an optical signal that is a component of the multi-channel optical signal. Each emission aperture 120 is located offset from the center of die 110 and near aperture corner 115 of die 110. The distance between emission aperture 120 and the edges of die 110 that form aperture corner 115 may be as small as, for example, a few micrometers (μm), though larger distances may also be used. Aperture corner 115 has an acute angle, specifically an angle that is less than or equal to one-fifth of 360 degrees, that is, 72 degrees. Each die 110 also includes a number of bonding pads 130, which convey to the die electric power, an electronic form of the information that is to be transmitted as the optical signal component and possibly control signals.

Die 110 are positioned on top of, and attached to, substrate 140 (herein "die" is used as both singular and plural). Die 110 are arranged so that aperture corners 115 are near each other. The die used are generally, but not necessarily, positioned with a space between them to prevent unwanted electronic connections or damage during assembly. Such a space may be as small as a few micrometers. In this embodiment of the invention, aperture corners 115 are adjacent, that is, they are separated only by this space.

Emission apertures 120 of all die 110 collectively define signal-emitting area 125. Signal-emitting area 125 is circular and emission apertures 120 are equally spaced just inside its circumference. Each die 110 is oriented with aperture corner 115 of that die pointing toward the center of signal-emitting area 125, thus positioning each emission aperture 120 near the other emission apertures 120.

Optical conduit 150 is cylindrical and has a circular cross section. This circular cross section is concentric with and has a somewhat larger diameter than signal-emitting area 125. For simplicity and visibility of other features, optical conduit 150 is shown as being transparent in FIG. 1A. End 155 of optical conduit 150 is the signal-receiving area of the optical conduit. Direct butt coupling is used between signal-emitting area 125 and optical conduit 150.

In some embodiments of the invention, optical conduit 150 is the core of an optical Fiber. The optical fiber used in some embodiments has a core diameter that is lot less than 100 μm. Other embodiments (particularly, but not necessarily, those for short distance communication) may employ optical fibers with relatively large core diameters, for example, up to 1000 μm. In some embodiments, the optical fiber has a core diameter that is equal to the diameter of the signal-emitting area.

Some embodiments of the invention couple the multi-channel optical signal to an optical conduit other than an optical fiber. Such an optical conduit may include, but is not limited to, an optical path in free space, an external imaging device, an optical waveguide, or an optical signal transport device. The external imaging device used may be, for example, a lens or an assembly of lenses, or mirrors, or both, used along with free-space optical links to convey the multi-channel optical signal from the optical signal emitter to a receiver.

Each die 110 is shaped to have aperture corner 115 that has an acute angle of less than or equal to 72 degrees and emission aperture 120 is located offset from the center of die 110 in the direction of aperture corner 115. These two features allows five or more die 110 to be placed on substrate 140 with aperture corners 115 and emission apertures 120 near each other, that is, located within an area similar in diameter to signal-receiving area 155 of optical conduit 150. Reducing the diameter of the signal-emitting area may advantageously allow use of an optical fiber with a smaller core diameter, eliminate the need for an optical imaging element, or both.

In various embodiments of the invention, various numbers of die may be used to generate optical signal components that form a single optical signal and couple to the same optical conduit. Typically, the number of die that can be used is related to the (geometry of the individual die. In general, the smaller the angle of the aperture corner, the more emitters may be coupled to the same optical fiber.

In some embodiments of the invention, the geometry of the individual die is related to the maximum number of die by the following equation:

$$\theta \leq \frac{360°}{N} \quad \text{(Eq. 1)}$$

where θ is the angle of the aperture corner of the die and N is the maximum number of die used in the optical signal emitter. For example, θ is less than or equal to 72° when N is 5. In other embodiments of the invention, that of FIG. 3 for example, Eq. 1 does not apply.

In various embodiments, each die has a shape that, among other possible shapes, is a parallelogram, a trapezoid, or a triangle. In some embodiments, the aperture corner of each die is rounded. Other acute-angled corners of each die may be rounded, or all corners of each die may be rounded. Rounded corners may advantageously prevent the die from being damaged in handling and assembly, or they may allow the die to be positioned somewhat closer together In various embodiments of the invention, the die may be arranged such that the emission apertures are positioned in a circle, an oval, a polygon, or another shape. A circular arrangement tends to reduce the size of the signal-emitting area. Nevertheless, other arrangements may provide a signal-emitting area that is small enough to meet the requirements of a particular design, may be simpler to design, or may be advantageous in manufacturing.

When a circular arrangement is used, the size of the signal-emitting area may be represented by the diameter of the smallest circle that encompasses all of the emission apertures. The size of signal-emitting areas of non-circular shapes may be measured by a height and a width, or by other parameters.

The emission aperture of each die is part of an opto-electronic device within the die. The opto-electronic device is configured to emit a component of the multi-channel optical signal from the emission aperture. In various embodiments of the invention, various types of opto-electronic devices may be used. Suitable opto-electronic devices include, but are not limited to, light emitting diodes, semiconductor lasers, and vertical cavity surface emitting lasers (VCSELs).

Some embodiments of the invention advantageously employ VCSELs, which are currently a leading technology for semiconductor opto-electronics. VCSELs can be tested while still in wafer form. They have excellent reliability. They produce a beam with relatively small, if any, angular divergence, compared to edge emitting lasers. The circularly-symmetric output beam that VCSELs produce facilitates collecting the emitted beams. Because the wavelength at which the lasing process occurs can be selected by fabricating VCSELs with different cavity lengths, they are well suited for use in WDM systems.

In some embodiments of the invention, the optical signal component that is emitted by each die has a wavelength different from that of the optical signal component emitted by any other die. In other embodiments, multiple die emit optical signal components at the same wavelength to provide fail-safe redundancy, to increase the intensity of that component, or for other reasons.

An efficient coupling between the optical signal emitter and the optical conduit, is usually desirable. That is, a substantial portion of each of the optical signal components emitted should enter the optical conduit. In some embodiments of the invention, coupling efficiency is advantageously increased by a design that meets the two conditions. First, the diameter of signal-receiving area 155 should be equal to or greater than the diameter of signal-emitting area 125. Second, the numerical aperture of the optical fiber should be equal to or greater than the numerical aperture of the emission apertures.

The numerical aperture of a light emitter indicates the angular divergence of the emitted light. Similarly, the numerical aperture of a light receiver indicates the range of angles from which light may be incident on the receiver and still be efficiently coupled into the receiver.

Some embodiments of the invention include an optical imaging element, such as a lens, that is configured to image the optical signal components emitted from the signal-emitting area into the optical conduit. In some embodiments, sufficient light enters the optical conduit without optimum coupling efficiency. Nevertheless, the coupling efficiency is increased in embodiments using an optical imaging element when the signal-receiving area of the optical conduit has a diameter that is given by the following relationship:

$$Df \geq De*M \quad \text{(Eq. 2)}$$

where Df is the diameter of the signal-receiving area of the optical conduit, De is the diameter of the signal-emitting area of the optical signal emitter and M is the magnification factor of the optical imaging element. For example, the optimum signal-receiving area diameter is greater than or equal to 50 µm when the signal-emitting area diameter is 100 µm and the magnification factor is 0.5.

Coupling, efficiency is also increased when each emission aperture has a numerical aperture that is given by the following relationship:

$$Ae \leq Af*M \quad \text{(Eq. 3)}$$

where Ae is the numerical aperture of the emission apertures, Af is the numerical aperture of the optical conduit and M is the magnification factor of the optical imaging element. For example, the optimum numerical aperture of the emission apertures is less than or equal to 0.1 when the numerical aperture of the optical conduit is 0.2 and the magnification factor is 0.5.

While M is typically less than one, that is the lens typically de-magnifies, Eqs. 2 and 3 still hold when the lens magnifies the light from the emission apertures, that is, when the value of M is greater than one.

Figure 2:
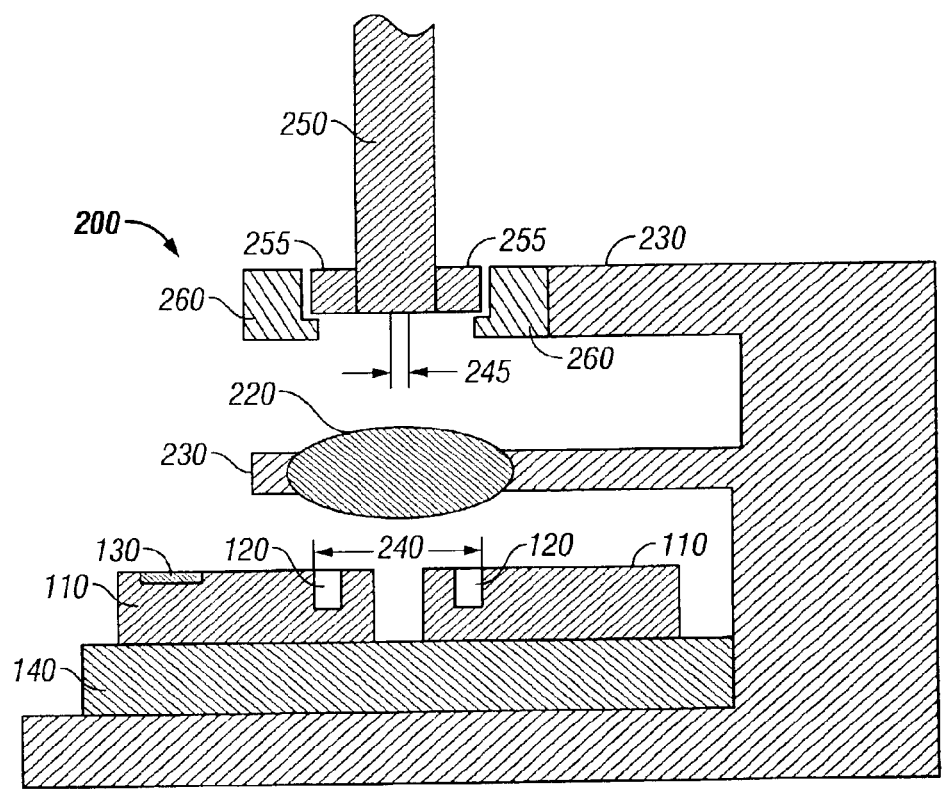
FIG. 2 shows a cross sectional view of a second example of the invention, in which a lens focuses independent components of a multi-channel optical signal into an optical fiber.

FIG. 2 is a cross sectional view of optical signal emitter 200, according to an embodiment of the invention. Optical signal emitter 200 includes die 110, emission apertures 120, pads 130, and substrate 140, which are similar to those described above with respect to FIGS. 1A and 1B.

Optical signal emitter 200 also includes receptacle 260, optical fiber 250 and ferrule 255, which together function in a manner similar to that of optical conduit 150, as shown in FIG. 1. During assembly, the end of optical fiber 250 is inserted into ferrule 255, which surrounds and secures the end of the fiber. Then, end of optical fiber 250 and the bottom of the ferrule may be, but need not be, polished together to form a smooth surface, which aids the coupling efficiency. The fiber and ferrule assembly is then inserted into receptacle 260, which surrounds and secures the fiber and ferrule assembly. Receptacle 260 and ferrule 255 constitute a connector, by means of which various optical fibers may be plugged into or removed from optical signal emitter 200 when the emitter is initially installed in an optical communication system or when maintenance is performed.

Emission apertures 120 form the signal-emitting area, the size of which is indicated by diameter 240. The end of the core portion of optical fiber 250 forms the signal-receiving area the size of which is indicted by diameter 245.

Optical signal emitter 200 also includes optical imaging element 220 which is a simple bi-convex lens configured to image the optical signal components emitted from the signal-emitting area into the signal-receiving area, that is, from emission apertures 120 into the core of optical fiber 50.

Optical signal emitter 200 also includes housing 230, which secures receptacle 260, optical imaging element 220 and substrate 140 and which holds them in alignment with each other.

Various embodiments of the invention may use optical imaging elements that include a plano-convex lens, a graded-index (GRIN) lens, a diffractive optical element, a Fresnel lens, another type of lens, or any arrangement of one or more optical components functioning to image the optical signal components from the signal-emitting area onto the signal-receiving area.

To increase the efficiency with which the optical signal components are transferred from optical signal emitter 200 into optical fiber 250, Eqs. 2 and 3 should be applied. That is, optical imaging element 220 should have a magnification factor that is equal to or less than diameter 245 of the signal-receiving area divided by diameter 240 of the signal-emitting area. And the numerical aperture of emission apertures 120 should be less than or equal to the numerical aperture of optical fiber 250 multiplied by the magnification factor of optical imaging element 220.

In various embodiments of the invention, housing 230 may be any device, apparatus or material that secures receptacle 260, optical imaging element 220 and substrate 140 and that holds them in alignment with each other.

Figure 3:
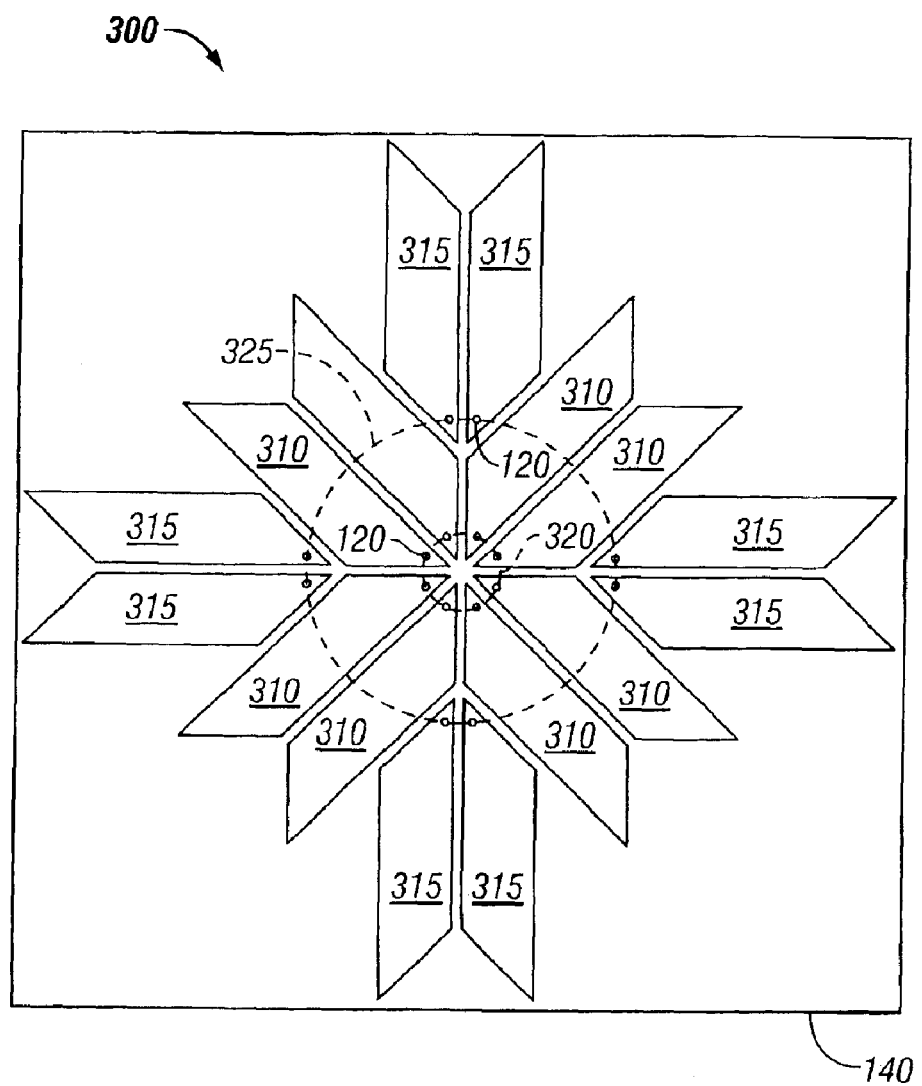
FIG. 3 shows a top view of a third example of the invention that emits a multi-channel optical signal with sixteen independent channels from emission apertures arranged in two concentric circles.

FIG. 3 is a top view of optical signal emitter 300 according to an embodiment of the invention. Optical signal emitter 300 emits an optical signal that includes sixteen independent components that are emitted from sixteen emission apertures 120 within eight inner die 310 and eight outer die 315. Except as described below, die 310 and 315, emission apertures 120, and substrate 140, as shown in FIG. 3, are similar to those described above with respect to FIGS. 1A, 1B and 2.

Each die 310 or 315 has the shape of a parallelogram. Two corners of the parallelogram have a first, acute angle, and two corners of the parallelogram have a second, obtuse angle. Each emission aperture 120 is located near one of the acute-angled corners of the parallelogram, which is the aperture corner of the die. Two layouts for die 310 and 315 are used. The layouts differ as to which of the two acute-angled corners of the parallelogram is the aperture corner.

In optical signal emitter 100 of FIGS. 1A and 1B, die 110 are placed on substrate 140 with aperture corners 115 lying just within the circumference of a single circle, which is signal-emitting area 125. Die 110 are adjacent to each other, that is, aperture corners 115 are separated only by space between die. Aperture corners 115 of die 110 all point toward the center of signal-emitting area 125.

Similarly, in optical signal emitter 300 of FIG. 3, the aperture corners of die 310 and 315 all point toward the center of signal-emitting area 125. Die 310 are positioned such that their emission apertures 120 lie on the circumference of inner circle 320 and are adjacent to each other, and die 315 are positioned such that their emission apertures lie on the circumference of outer circle 325.

However, unlike die 110 of optical signal emitter 100, the aperture corners of die 315 are not adjacent to each other. Rather, they are separated by the width of die 310. Nevertheless, the aperture corners of die 315 are near each other and near the aperture corners of die 310, that is, the separation is only the width of die 310 and the appropriate spacing between adjacent die.

In some embodiments of the invention, the die used may be arranged with their apertures on more than two concentric circles. In other embodiments, the width of more than one die may separate the aperture corners that lie on an outer circle.

The signal-emitting area of optical signal emitter 300 is the smallest circle that encompasses all emission apertures of die 310 and 315. It is generally advantageous to keep the diameter of the signal-emitting area small; thus, in this embodiment it is advantageous to keep the width of die 310 narrow.

Figure 4:
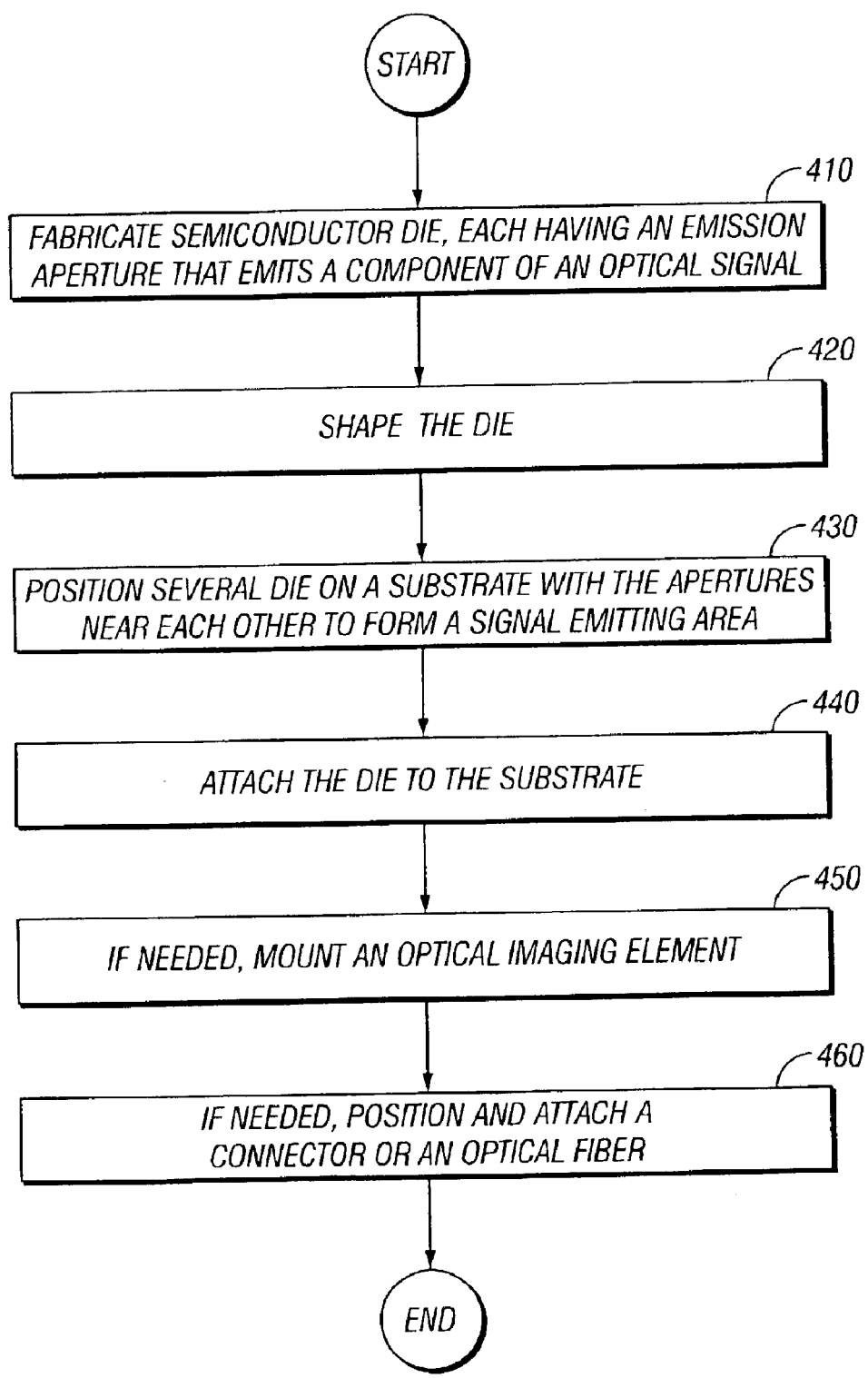
FIG. 4 illustrates some process blocks in an example method of making the invention.

FIG. 4 is a flow chart that illustrates some of the process blocks used in an example method of making an optical signal emitter according to an embodiment of the invention. Various methods are used to manufacture various embodiments of the invention. Such methods include, but are not limited to those that alter, omit, add to, or rearrange the process blocks shown in FIG. 4.

In block 410, a number of separate semiconductor die are fabricated. Each die is configured to emit from an emission aperture a component of a multi-channel optical signal. The emission aperture is not positioned at the center of the die, rather it is offset from the center in the direction of the aperture corner of the die. Generally, the component emitted is at a wavelength that is unique among the die that are to be assembled onto the same substrate. In embodiments of the invention that use VCSELs, the wavelength emitted can be controlled by the controlling length of the cavity formed within the VCSEL during the manufacturing process.

Next in block 420, each semiconductor die is shaped. The die is shaped to form the aperture corner, although block 420 may include shaping all edges and corners of the die. Block 420 may be omitted if square or rectangular die are used. The shaping process may include, but is not limited to, forming one or more corners of the die to include an acute angle, forming one or more corners of the die to be rounded, or a combination thereof. A rounded corner need not have the shape of a circular arc. The corner may have the shape of an elliptical arc, or the shape of another curve.

Compared to using rectangular semiconductor die, a shaping process that forms aperture corners in the die with an acute angle advantageously allows more emission apertures to be positioned within a smaller signal-emitting area. Compared to using die with sharp corners, a shaping process that forms die corners that are rounded may advantageously allow more emission apertures to be positioned within a smaller signal-emitting area, may advantageously prevent damage to the die during handling and assembly, or both.

In some embodiments of the invention, the shaping process both shapes the die and separates individual die from a semiconductor wafer that contains many such die. In other embodiments, the die are separated from the wafer using techniques typically used to separate square or rectangular die, and then the shape of each individual die is altered.

A typical scribe and cleave technique to separate a semiconductor wafer into die includes first weakening the wafer by using a scribe, which typically has a diamond tip, to cut grooves into the top surface of the wafer. These grooves are always cut parallel to an axis of the crystalline structure of the semiconductor material that comprises the wafer. Then, the wafer is cleaved and breaks along these grooves. Because scribe and cleave techniques depend on the orientation of the axes of the crystalline structure, they cannot be used to form corners having angles of other than 90 degrees, nor can they be used to form rounded corners.

In some embodiments of the invention, photolithography is used to define the shape and size of at least the aperture corner of the die or of the overall shape of the die. Photolithographic shaping of features is well known in the art of semiconductor fabrication.

In some embodiments of the invention, the die are shaped by reactive ion etching of the semiconductor material. Reactive ion etching may be used to etch a vertical wall through the entire thickness of the die at the location of a desired edge or a desired corner. The shape and position of the desired edge may be precisely defined using standard photolithographic techniques or using other techniques. Both reactive ion etching of semiconductor material and the use of photolithographic techniques to control reactive ion etching are well known in the art of semiconductor fabrication.

Block 420 is optional in embodiments of the invention that use square or rectangular die.

Next in block 430, the die is positioned on a substrate with the emission apertures are located near each other. The emission apertures form a signal-emitting area. Then, in block 440, the die are attached to the substrate. In some embodiments of the invention, the positioning of block 430 and the attaching of block 440 are performed in a single operation.

Next, in optional block 450, an optical imaging element, such as a lens, is mounted near the signal-emitting area and coupled to the substrate, for example, by a housing. Then, in optional block 460, an optical conduit, such as an optical fiber, is coupled to the substrate, for example, by the housing. In various embodiments, the optical conduit is positioned near the optical imaging component, or near the signal-emitting area.

The details of how to apply these techniques, and other techniques, to fabricate various embodiments of this invention are well within the skill of those working in the relevant technologies.

In some embodiments of the invention, an automated assembly system may be used to position and attach the semiconductor die to the substrate, which can facilitate achieving the precise and close spacing, required among the die and their emission apertures. In other embodiments, a vacuum apparatus may be used to handle and position the die, rather than using tweezers or other edge gripping mechanisms.

Using the methods disclosed herein, alignment tolerances on the order of one micrometer can be achieved between the edge of the emission aperture within a die and the within edges of the die itself. In particular, reactive ion etching overcomes the problems associated with previous methods in that the distance between the emission aperture and the edge of the die can be decreased. Reactive ion etching results in relatively smaller alignment errors. The die edges produced by reactive ion etching are relatively stable and relatively immune to damage caused by forces such as may occur while handling the individual die after being separated and prior to being attached to the substrate.

Additionally, by using reactive ion etching, the shape of the die no longer need be limited to a rectangle or square. Edges at any angle, edges that are curved, and corners that are rounded can be created. Using the methods disclosed herein, the individual die can be configured into a variety of shapes and arranged in a variety of designs or patterns to maximize the number of die that are positioned within the diameter of the optical fiber, or to minimize the signal-emitting area of the optical signal emitter.

The foregoing drawing figures and descriptions are not intended to be exhaustive or to limit the invention to the forms disclosed. Rather, specific details are presented to illustrate the invention. In light of the teachings herein, the techniques known to those skilled in the art, and advances in the art yet to be made, numerous modifications, variations, selections among alternatives, changes in form, and improvements can be made to the invention. The scope of the invention is set forth by the following claims and their legal equivalents.

What is claimed is:

1. An apparatus configured to emit a multi-channel optical signal, the apparatus comprising:
   a plurality of semiconductor die, each die having an aperture corner and an emission aperture located offset from a center of the die toward the aperture corner and each die being configured to emit a component of the multi-channel optical signal from the emission aperture; and
   a substrate to which the die are attached, the die collectively defining a signal-emitting area and each die being oriented with its aperture corner toward the center of the signal-emitting area.

2. The apparatus of claim 1, wherein the plurality of die comprises five die and the aperture corner of each die has an angle of not more than 72 degrees.

3. The apparatus of claim 1, wherein each die has a shape selected from a group consisting of a parallelogram, a trapezoid, and a triangle.

4. The apparatus of claim 1, wherein each die has a shape selected from a group consisting of a shape in which the aperture corner is rounded; a shape in which all acute-angled corners are rounded; and a shape in which all corners are rounded.

5. The apparatus of claim 1, wherein each die includes an opto-electronic device configured to emit the optical signal component, the opto-electronic device being selected from a group consisting of a vertical cavity surface emitting laser (VCSEL), a semiconductor laser and a light emitting diode (LED).

6. The apparatus of claim 1, wherein the optical signal component emitted from each die has a wavelength different from a wavelength of the optical signal components emitted by any other die.

7. The apparatus of claim 1, and further comprising an optical conduit aligned with the signal-emitting area.

8. The apparatus of claim 7, wherein the optical conduit is selected from a group consisting of an optical fiber, a receptacle for an external fiber, an external imaging device, an optical waveguide, and a combination of at least two thereof.

9. The apparatus of claim 7, wherein the optical conduit has a first numerical aperture and each of the emission apertures has a numerical aperture that does not exceed the first numerical aperture.

10. The apparatus of claim 7, and further comprising an optical imaging element having a magnification factor and being configured to image the optical signal components emitted from the signal-emitting area into the optical conduit.

11. The apparatus of claim 10, wherein the optical conduit has a signal-receiving area not smaller than the signal-emitting area multiplied by the magnification factor of the optical imaging element.

12. The apparatus of claim 10, wherein each of the emission apertures has a numerical aperture that does not exceed a numerical aperture of the optical conduit multiplied by the magnification factor.

13. An apparatus for emitting a multi-channel optical signal, the apparatus comprising:
    a plurality of emitting means, each for emitting a channel of the multi-channel optical signal from an emission aperture that is located near an aperture corner of the emitting means; and
    means for positioning each of the emitting means such that the emission aperture of each emitting means is located near the emission apertures of the other emitting means and the emission apertures collectively define a signal-emitting area of the apparatus.

14. The apparatus of claim 13, wherein each emitting means includes an opto-electronic device selected from a group consisting of a vertical cavity surface emitting laser (VCSEL), a semiconductor laser and a light emitting diode (LED).

15. The apparatus of claim 13, wherein each emitting means has a shape selected from a group consisting of a parallelogram; a trapezoid; and a triangle.

16. The apparatus of claim 13, wherein each emitting means has a shape selected from a group consisting of a shape in which the aperture corner is rounded; a shape in which all acute-angled corners are rounded; and a shape in which all corners are rounded.

17. The apparatus of claim 13, and further comprising conveying means for conveying the multi-channel optic signal, the conveying means having a conveying numerical aperture.

18. The apparatus of claim 17, wherein each of the emission apertures has a numerical aperture not exceeding the conveying numerical aperture.

19. The apparatus of claim 17, and further comprising imaging means for imaging the optical signal components into the conveying means, the imaging means having a magnification factor.

20. The apparatus of claim 19, wherein the conveying means has a signal-receiving area not smaller than the signal-emitting area multiplied by the magnification factor.

21. The apparatus of claim 19, wherein each of the emission apertures has a numerical aperture not exceeding the conveying numerical aperture multiplied by the magnification factor.

22. The apparatus of claim 1, wherein each of said plurality of semiconductor die has a shape formed by photolithography.

23. The apparatus of claim 1, wherein said aperture corner of each of said plurality of semiconductor die is formed by photolithography.

24. The apparatus of claim 1, wherein each of said plurality of semiconductor die has a shape formed by reactive ion etching.

25. The apparatus of claim 1, wherein said aperture corner of each of said plurality of semiconductor die is formed by reactive ion etching.

* * * * *